US010069277B2

(12) United States Patent
Kobayashi

(10) Patent No.: US 10,069,277 B2
(45) Date of Patent: Sep. 4, 2018

(54) VARIABLE WAVELENGTH LASER DEVICE

(71) Applicant: NEC CORPORATION, Tokyo (JP)

(72) Inventor: Naoki Kobayashi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 15/533,885

(22) PCT Filed: Dec. 8, 2015

(86) PCT No.: PCT/JP2015/006078
§ 371 (c)(1),
(2) Date: Jun. 7, 2017

(87) PCT Pub. No.: WO2016/092810
PCT Pub. Date: Jun. 16, 2016

(65) Prior Publication Data
US 2017/0353007 A1 Dec. 7, 2017

(30) Foreign Application Priority Data

Dec. 12, 2014 (JP) .................................. 2014-251457

(51) Int. Cl.
*G02F 1/035* (2006.01)
*H01S 5/068* (2006.01)
(Continued)

(52) U.S. Cl.
CPC .............. *H01S 5/068* (2013.01); *G02F 1/011* (2013.01); *H01S 5/026* (2013.01); *H01S 5/14* (2013.01);
(Continued)

(58) Field of Classification Search
CPC . H01S 5/068; H01S 5/026; H01S 5/14; H01S 5/06821; H01S 5/0261;
(Continued)

(56) References Cited

U.S. PATENT DOCUMENTS 6,455,930 B1* 9/2002 Palanisamy ......... H01S 5/02248
174/252
6,594,288 B1* 7/2003 Putnam ................... H01S 3/302
372/20
(Continued)

FOREIGN PATENT DOCUMENTS

JP 2003-215369 A 7/2003
JP 2003-228031 A 8/2003
(Continued)

OTHER PUBLICATIONS

International Search Report of PCT/JP2015/006078, dated Mar. 1, 2016, [PCT/ISA/210].
(Continued)

*Primary Examiner* — Thomas A Hollweg
*Assistant Examiner* — Guy Anderson
(74) *Attorney, Agent, or Firm* — Sughrue Mion, PLLC

(57) ABSTRACT

Provided is a variable wavelength laser device that achieves phase control of high precision while restraining thermal interference and stably outputs emission light of desired wavelength.
The variable wavelength laser device of the present invention includes: an optical amplification means including a low-reflective surface that reflects light of wavelengths other than a predetermined wavelength and emits light of the predetermined wavelength; a wavelength control means for controlling wavelength of light being transmitted through the optical waveguide; a phase control means for controlling phase of light being transmitted through the optical waveguide using heat emitted by a heating means; a reflection means for totally reflecting the inputted light; and a heat dissipation means for restraining transfer of heat emitted by the heating means to regions other than a region in which the phase control means is disposed.

4 Claims, 9 Drawing Sheets

(51) Int. Cl.
*H01S 5/026* (2006.01)
*H01S 5/14* (2006.01)
*G02F 1/01* (2006.01)

(52) U.S. Cl.
CPC ...... *G02F 2201/06* (2013.01); *G02F 2203/15* (2013.01); *G02F 2203/21* (2013.01)

(58) Field of Classification Search
CPC .. G02F 1/011; G02F 2201/06; G02F 2203/15; G02F 2203/21
USPC ............................................................ 385/3
See application file for complete search history.

(56) References Cited

U.S. PATENT DOCUMENTS

| | | | | |
|---|---|---|---|---|
| 6,836,489 B2* | 12/2004 | Nishimura | ............ | H01S 5/0687 372/20 |
| 7,023,886 B2* | 4/2006 | Deacon | ................... | H01S 5/026 372/20 |
| 8,885,675 B2* | 11/2014 | Yamazaki | ............... | H01S 5/142 372/20 |
| 2003/0201462 A1 | 10/2003 | Pommer | ............. | G02B 6/4201 257/200 |
| 2004/0028095 A1* | 2/2004 | Ishida | ................ | H01S 5/02252 372/36 |
| 2005/0036746 A1* | 2/2005 | Scheibenreif | ........ | G02B 6/4201 385/92 |
| 2005/0116179 A1* | 6/2005 | Aguirre | ................ | A61C 19/004 250/492.1 |
| 2006/0088066 A1* | 4/2006 | He | ....................... | H01S 5/0265 372/10 |
| 2006/0222039 A1* | 10/2006 | Yamazaki | ............. | H01S 5/0612 372/94 |
| 2006/0251425 A1* | 11/2006 | Kupershmidt | ......... | G02B 6/022 398/147 |
| 2008/0056311 A1* | 3/2008 | Takeuchi | ............... | H01S 5/0612 372/20 |
| 2008/0137698 A1* | 6/2008 | Sorin | ................... | H04B 10/506 372/23 |
| 2011/0013654 A1* | 1/2011 | Yamazaki | ............. | H01S 5/0687 372/29.02 |
| 2011/0149365 A1* | 6/2011 | Cho | ...................... | G02B 6/4215 359/245 |
| 2011/0198570 A1* | 8/2011 | Venkatasubramanian | ................... | H01L 23/3677 257/30 |
| 2012/0189025 A1* | 7/2012 | Zheng | ................... | H01S 5/1071 372/20 |
| 2013/0182732 A1* | 7/2013 | Abdou Ahmed | ....... | H01S 5/141 372/29.011 |
| 2013/0264577 A1* | 10/2013 | Xu | .......................... | H01L 33/60 257/76 |
| 2014/0233090 A1* | 8/2014 | Sugihara | .................. | G02F 1/37 359/328 |

FOREIGN PATENT DOCUMENTS

| | | |
|---|---|---|
| JP | 2008-60445 A | 3/2008 |
| JP | 2008-226985 A | 9/2008 |
| WO | 2007/129544 A1 | 11/2007 |
| WO | 2009/119284 A1 | 10/2009 |

OTHER PUBLICATIONS

Written Opinion of PCT/JP2015/006078, dated Mar. 1, 2016, [PCT/ISA/237] with Partial English Translation.
Communication dated Nov. 21, 2017, from the Japanese Patent Office in counterpart application No. 2016-563501.

\* cited by examiner

VARIABLE WAVELENGTH LASER DEVICE 900

VARIABLE WAVELENGTH LASER DEVICE

This application is a National Stage of International Application No. PCT/JP2015/006078 filed Dec. 8, 2015, claiming priority based on Japanese Patent Application No. 2014-251457, filed Dec. 12, 2014, the contents of all of which are incorporated herein by reference in their entirety.

TECHNICAL FIELD

The present invention relates to variable wavelength laser devices and in particular to a variable wavelength laser device including a semiconductor optical amplifier and a ring resonator type variable wavelength filter.

BACKGROUND ART

The present day 40 G/100 G digital coherent communication employs modulation formats such as differential quadrature phase shift keying (DQPSK). To realize 400 G communication in the future, application of multi-level modulation formats such as quadrature amplitude modulation (16 QAM) is being studied for the next-generation modulation format.

One of the important characteristics of the light source required for multi-level modulation formats is a narrow line-width. One of the effective light sources for realizing a narrow line-width is an external resonator type variable wavelength laser. An external resonator type variable wavelength laser has a resonator configured with a semiconductor optical amplifier (SOA) and an external reflection mirror, selects a wavelength by a variable wavelength filter inserted into the resonator and outputs light of the wavelength. An external resonator type variable wavelength laser is disclosed, for example, in PTL 1-3.

FIG. 9 is a plan view of a variable wavelength laser device described in PTL 1. The variable wavelength laser device 900 according to PTL 1 includes a SOA 910, a variable wavelength unit 920, a phase-variable unit 930, a reflection mirror unit 940, a first optical waveguide 951, and a second optical waveguide 952.

The SOA 910 supplies light to the ring resonator type variable wavelength unit 920.

The variable wavelength unit 920 is a multiple light resonator formed by coupling by optical coupling means three ring resonators 921, 922, 923 having optical path lengths different from one another. The variable wavelength unit 920 controls the temperatures of the ring resonators 921, 922, 923 by using film heaters 924, 925, 926, respectively, to control the wavelength of light passing through the first optical waveguide 951.

The phase-variable unit 930 changes the temperature of the second optical waveguide 952, which connects the variable wavelength unit 920 and the reflection mirror unit 940, by using a heater 931 to control the phase of light passing through the second optical waveguide 952.

The reflection mirror unit 940 totally reflects the light passing through the variable wavelength unit 920 and the phase-variable unit 930 and returns the light to the phase-variable unit 930 and the variable wavelength unit 920.

In the variable wavelength laser device 900 configured as described above, resonant light is generated by the light outputted from the SOA 910, passing through the variable wavelength unit 920 and the phase-variable unit 930, and reflected by the reflection mirror unit 940. The SOA 910 only transmits light of a predetermined wavelength to accomplish single longitudinal mode oscillation.

CITATION LIST

Patent Literature

[PTL 1] International Publication WO 2009/119284
[PTL 2] Japanese Unexamined Patent Application Publication No. 2008-60445
[PTL 3] International Publication WO 2007/129544

SUMMARY OF INVENTION

Technical Problem

In PTL 1, where the phase of light passing through the second optical waveguide 952 is controlled by controlling the temperature of the second optical waveguide 952 connecting the variable wavelength unit 920 and the reflection mirror unit 940, the desired amount of change is achieved by increasing the electric power supply to the heater 931 because of a lack of effective length sufficient for the phase control.

Increasing the electric power supply to the heater 931, however, leads to temperature rise not only in the phase-variable unit 930 but also in the variable wavelength unit 920 and the SOA 910, where the temperature rise is unnecessary. When an unintended temperature rise occurs in the variable wavelength unit 920, the oscillation wavelength shifts towards the longer side. When an unintended temperature rise occurs in the SOA 910, the light output intensity declines. Such changes in characteristics accompanying an unintended temperature rise are called thermal interference.

The present invention has been made in view of the above-described problems and an object of the present invention is to provide a variable wavelength laser device that achieves phase control of high precision while restraining thermal interference and stably outputs emission light of desired wavelength.

Solution to Problem

To achieve the above-described objective, a variable wavelength laser device according to the present invention includes: an optical waveguide transmitting light between an optical amplification means and a reflection means; the optical amplification means having a non-reflective surface that inputs and outputs light traveling to and from the reflection means and a low-reflective surface that reflects light of a wavelength other than a predetermined wavelength and emits light of the predetermined wavelength, a wavelength control means for controlling wavelength of light being transmitted through the optical waveguide; a phase control means for controlling phase of light being transmitted through the optical waveguide using heat emitted by a heating means; the reflection means for returning light coming through the wavelength control means and the phase control means back to the wavelength control means and the phase control means; and a heat dissipation means for restraining transfer of heat emitted by a heating means to a region other than a region in which the phase control means is disposed.

Advantageous Effects of Invention

According to the above-described aspect of the present invention, there is provided a variable wavelength laser device that achieves phase control of high precision while restraining thermal interference and stably outputs emission light of desired wavelength.

DESCRIPTION OF EMBODIMENTS

First Example Embodiment

Figure 1:
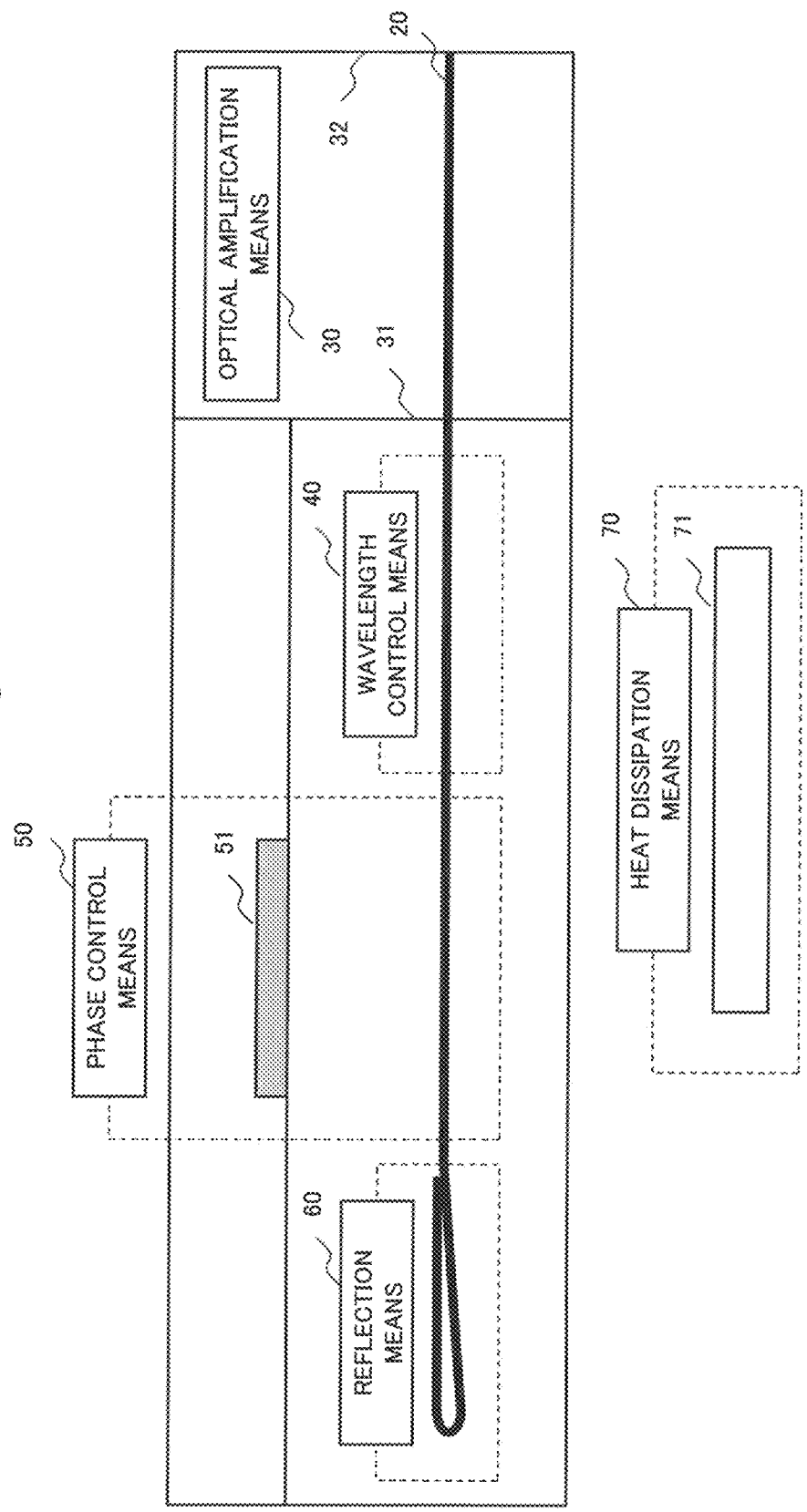
FIG. 1 is a block configuration diagram of a variable wavelength laser device 10 according to a first example embodiment.

A first example embodiment according to the present invention will be described. FIG. 1 is a block configuration diagram of a variable wavelength laser device according to the present example embodiment. In FIG. 1, the variable wavelength laser device 10 includes an optical waveguide 20, an optical amplification means 30, a wavelength control means 40, a phase control means 50, a reflection means 60, and a heat dissipation means 70.

The optical waveguide 20 transmits light between the optical amplification means 30 and the reflection means 60.

The optical amplification means 30 includes a non-reflective surface 31 that inputs and outputs light traveling to and from the reflection means 60 and a low-reflective surface 32 that reflects light of wavelengths other than a predetermined wavelength while emitting light of the predetermined wavelength, and the optical amplification means 30 supplies light to the wavelength control means 40 and the phase control means 50. The light supplied by the optical amplification means 30 passes through the wavelength control means 40 and the phase control means 50, is inputted to the reflection means 60, and is reflected by the reflection means 60. The light then passes through the wavelength control means 40 and the phase control means 50 again, is inputted to the optical amplification means 30, and is reflected by the low-reflective surface 32. Only the light of a predetermined wavelength controlled by the wavelength control means 40 is outputted from the low-reflective surface 32 to the outside as laser emission light.

The wavelength control means 40 controls the wavelength of the light transmitted through the optical waveguide 20.

The phase control means 50 includes a heating means 51 and controls the phase of light transmitted through the optical waveguide 20 using heat emitted from the heating means 51.

The reflection means 60 returns the light passing through the wavelength control means 40 and the phase control means 50 to the wavelength control means 40 and the phase control means 50. As described above, the light supplied by the optical amplification means 30 makes a round trip between the low-reflective surface 32 of the optical amplification means 30 and the reflection means 60.

The heat dissipation means 70 restrains transfer of heat emitted by the heating means 51 of the phase control means 50 to regions other than the region in which the phase control means 50 is disposed. The heat dissipation means 70 may be constituted with, for example, a heat dissipation member 71 disposed beneath the wavelength control means 40 or the phase control means 50. More specifically, when the optical waveguide 20, the wavelength control means 40, and the phase control means 50 are formed on the same substrate, and the substrate is disposed above a plate member (not illustrated) by using a support, the heat dissipation means 70 is constituted with the heat dissipation member 71 disposed between the substrate and the plate member. In other words, heat emitted by the heating means 51 is dissipated to the plate member through the heat dissipation member 71, restraining transfer of heat emitted by the heating means 51 to the wavelength control means 40 and the like and restraining occurrence of thermal interference in the wavelength control means 40 and the like.

As has been described above, the variable wavelength laser device 10 according to the present example embodiment restrains transfer of heat emitted by the heating means 51 to the regions other than the region in which the phase control means 50 is disposed, by using the heat dissipation means 70. Therefore, the variable wavelength laser device 10 according to the present example embodiment achieves phase control of high precision while restraining thermal interference and stably outputs emission light of desired wavelength.

The heat dissipation member 71 only needs to restrain transfer of heat emitted by the heating means 51 to the wavelength control means 40, and the location, shape, and the like of the heat dissipation member 71 may be designed in a variety of ways. For example, when it is desired to proactively dissipate heat emitted by the heating means 51 to the plate member by the heat dissipation means 70, the heat dissipation member 71 is preferably formed with a sufficient height for reaching the substrate and disposed on the plate member and directly underneath the heating means 51. When it is desired to avoid occurrence of stress strain in the optical waveguide 20, which may be caused by the heat dissipation means 70 contacting the substrate, the heat dissipation member 71 is formed without a sufficient height for reaching the substrate. Furthermore, when it is desired to effectively heat the optical waveguide 20 by the heating means 51 in the phase control means 50, the heat dissipation member 71 is disposed not directly underneath the heating means 51 but on the plate member beneath the region where it is desired to avoid occurrence of thermal interference (for example, around the wavelength control means 40).

Second Example Embodiment

Figure 2:
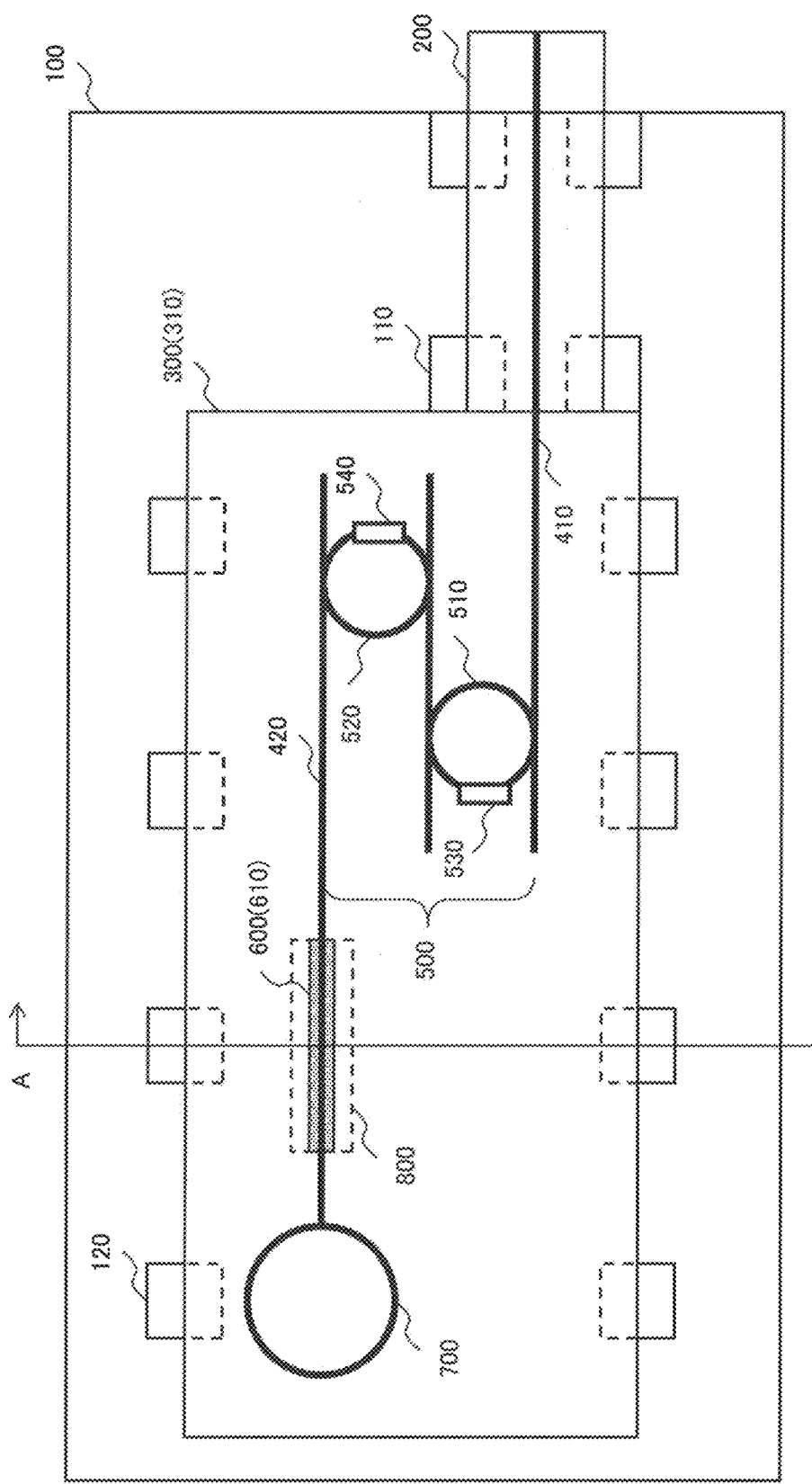
FIG. 2 is a plan view of a variable wavelength laser device 1000 according to a second example embodiment.
Figure 3:
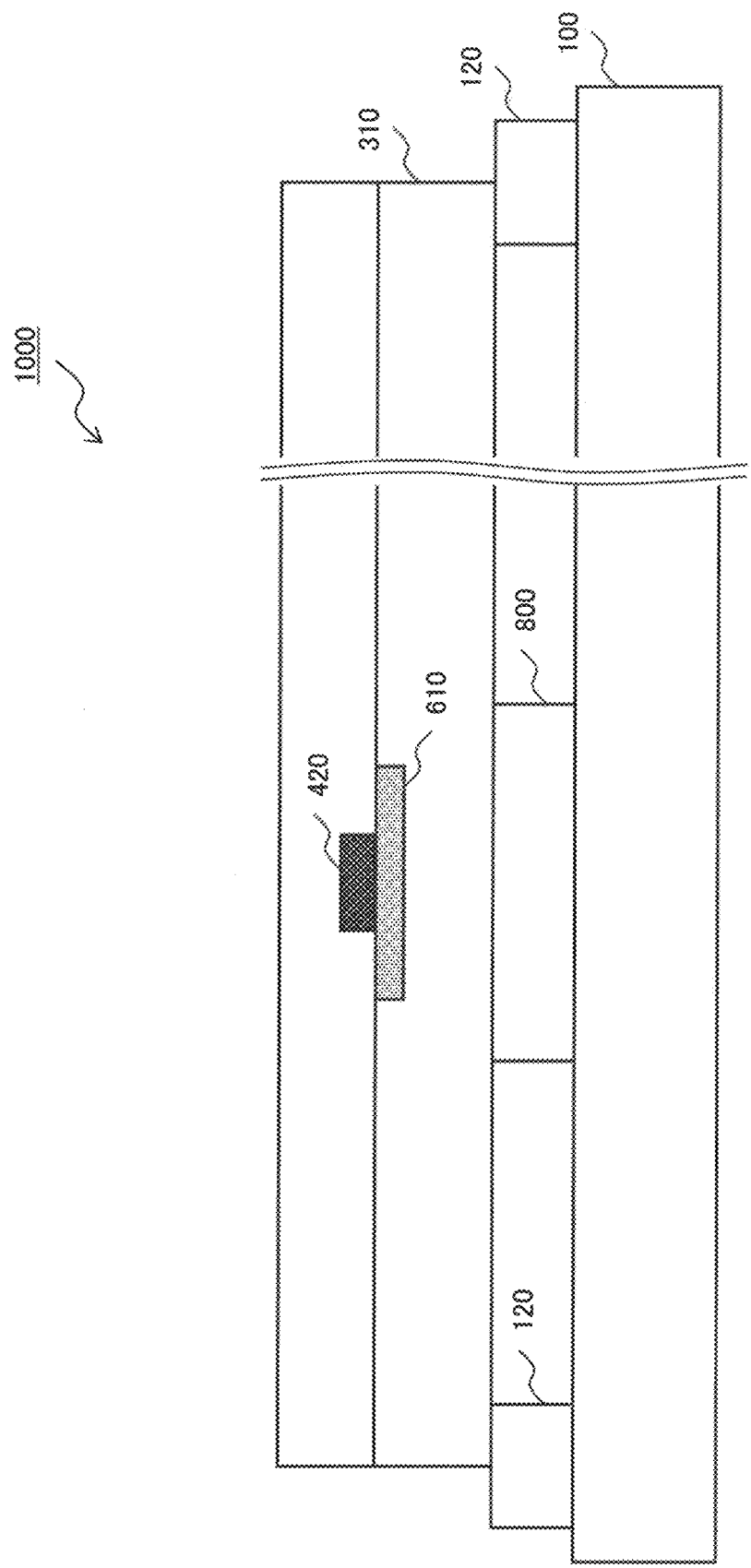
FIG. 3 is a cross sectional view of the variable wavelength laser device 1000 according to the second example embodiment.

A second example embodiment will be described. FIG. 2 is a plan view of a variable wavelength laser device according to the present example embodiment. FIG. 3 is a cross sectional view taken along the line A-A' of FIG. 2. In FIG. 2, the variable wavelength laser device 1000 includes a substrate 100, a semiconductor optical amplifier (SOA) 200, an external resonator 300, and a heat dissipation structure 800.

The SOA 200 and the external resonator 300 are fixed on the top surface of the substrate 100 by means of a plurality of supports 110, 120. The heat dissipation structure 800 is disposed in a predetermined region on the top surface of the substrate 100. In the present example embodiment, the heat dissipation structure 800 is disposed on the top surface of the substrate 100 beneath the heater 610. Note that a plate member in the claims encompasses the substrate 100 according to the present example embodiment.

The SOA 200 supplies light to the external resonator 300. The SOA 200 has non-reflective coating applied on one surface and low-reflective coating applied on the other surface, and the non-reflective coating surface is connected with a first optical waveguide 410 formed in the external resonator 300. The light outputted by the SOA 200 to the external resonator 300 passes through a wavelength control unit 500 and a phase control unit 600 of the external resonator 300, is then reflected by a reflection mirror unit 700, and passes through the phase control unit 600 and the wavelength control unit 500 again to be outputted to the SOA 200. A laser resonator is thus formed between the low-reflective coating of the SOA 200 and the reflection mirror unit 700. Of the laser emission light, only emission light of a predetermined wavelength is outputted from the low-reflective coating surface of the SOA 200 as a result of the control by the wavelength control unit 500 and the phase control unit 600.

The external resonator 300 includes a silicon substrate 310, a first optical waveguide 410, a second optical waveguide 420, a wavelength control unit 500, a phase control unit 600, and a reflection mirror unit 700, and functions as a ring resonator type variable wavelength filter. The external resonator 300 is a structure with an embedded-type optical waveguide formed by forming an oxide film on the silicon substrate 310 for increasing the refractivity of the core part. This embedded-type optical waveguide forms the first optical waveguide 410, the second optical waveguide 420, the wavelength control unit 500, the phase control unit 600, and the reflection mirror unit 700.

The first optical waveguide 410 inputs and outputs light traveling between the SOA 200 and the wavelength control unit 500. The second optical waveguide 420 inputs and outputs light traveling between the wavelength control unit 500 and the reflection mirror unit 700 via the phase control unit 600.

The wavelength control unit 500 is constituted with a multiple ring resonator in which two ring resonators 510, 520 having different optical path lengths coupled together. Thin film heaters 530, 540 are disposed on the optical waveguides of the ring resonators 510, 520, respectively, and the wavelength of light passing through the wavelength control unit 500 is controlled by changing the temperatures of the optical waveguides of the ring resonators 510, 520. The ring resonators 510, 520 have optical path lengths slightly different from each other, and only when the ring resonators 510, 520 resonate, they multiplex and demultiplex light of the resonant wavelength and obtain a large free spectral range (FSR) by Vernier effect.

The Vernier effect is a phenomenon that, when a plurality of resonators having different optical path lengths are employed in combination, the resonant frequency peaks of the resonators, which have different peak cycles, coincide at a frequency of the least common multiple of those frequencies. By exploiting the Vernier effect, a multiple light resonator employing a plurality of resonators in combination functions in such a manner that the apparent FSR is the frequency of the least common multiple of the frequencies of the resonators. This enables controlling frequency characteristic (wavelength) over a wider range than a single resonator.

The phase control unit 600 includes a heater 610. By changing the temperature of the second optical waveguide 420 located in the region of the phase control unit 600 by using the heater 610, the phase control unit 600 changes the refractivity and physical length of the second optical waveguide 420 and thereby controls the phase of light passing through the second optical waveguide 420. The heater 610 can be formed by vapor-depositing Ti and Pt or other methods.

The reflection mirror unit 700 totally reflects the light coming through the wavelength control unit 500 and the phase control unit 600 and returns the light to the phase control unit 600 and the wavelength control unit 500.

The heat dissipation structure 800 dissipates heat emitted by the heater 610 of the phase control unit 600 to the substrate 100. The heat dissipation structure 800 according to the present example embodiment is disposed on the top surface of the substrate 100 and beneath the heater 610. The heat dissipation structure 800 is formed, as illustrated in FIG. 3, with a sufficient height for reaching the silicon substrate 310 of the external resonator 300 from the top surface of the substrate 100 and with an area larger than the area of the heater 610.

When the heat dissipation structure 800 is not employed, in other words, when there is an empty space beneath the heater 610, heat emitted by the heater 610 stays in the air and is transferred to the neighboring wavelength control unit 500 and the like, causing thermal interference. In contrast, by disposing the heat dissipation structure 800 beneath the heater 610, heat emitted by the heater 610 dissipates to the substrate 100 through the heat dissipation structure 800. This restrains heat transfer to the neighboring wavelength control unit 500 and occurrence of thermal interference.

For example, when the height of the heat dissipation structure 800 is the same as the thickness of the external resonator 300, the heat dissipation into the external resonator 300 will be about the same as the heat dissipation to the heat dissipation structure 800, and the heat transfer to the wavelength control unit 500 and the like will be approximately half of the heat transfer in the case of the heat dissipation structure 800 not being employed.

In the variable wavelength laser device 1000 constituted as described above, the light outputted by the SOA 200 makes a round trip through the path of: the SOA 200→the first optical waveguide 410→the wavelength control unit 500→the second optical waveguide 420→the phase control unit 600→the second optical waveguide 420→the reflection mirror unit 700→the second optical waveguide 420→the phase control unit 600→the second optical waveguide 420→the wavelength control unit 500→the first optical waveguide 410→the SOA 200. The returning light is strongest when it has a wavelength resonant with the multiple ring resonator of the wavelength control unit 500. The returning light (emission light) inputted to the SOA 200 is outputted from the low-reflective coating surface of the SOA 200 as laser emission light.

As described above, in the variable wavelength laser device 1000 according to the present example embodiment having the heat dissipation structure 800 disposed beneath the heater 610, heat emitted by the heater 610 does not stay around the external resonator 300 but is dissipated to the substrate 100 through the heat dissipation structure 800. Therefore, the variable wavelength laser device 1000 according to the present example embodiment achieves phase control of high precision while restraining thermal interference and stably outputs emission light of desired wavelength.

Figure 4:
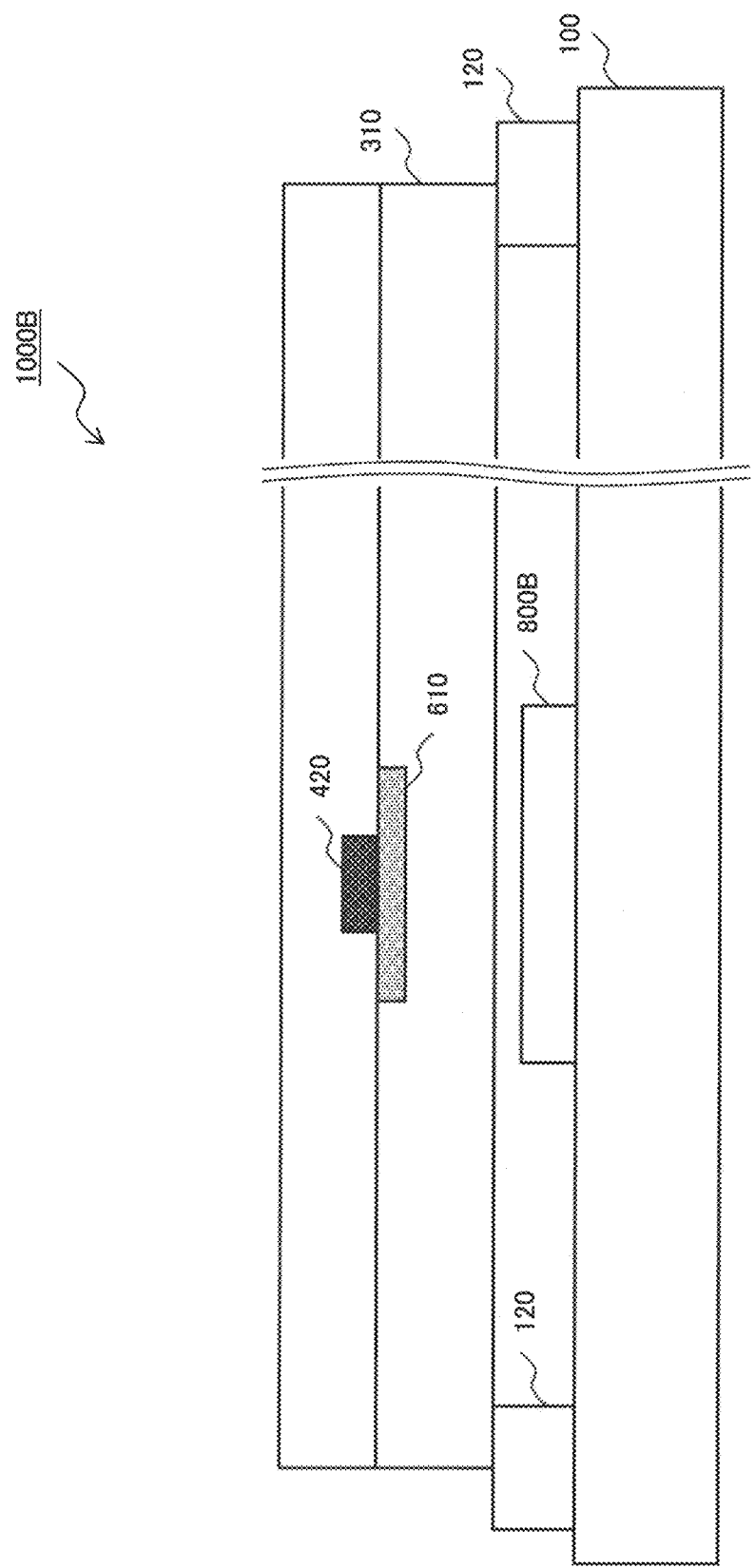
FIG. 4 is a cross sectional view of another variable wavelength laser device 1000B according to the second example embodiment.

When it is desired to avoid stress strain in the first optical waveguide 410, the second optical waveguide 420, and the like, which may be caused by the heat dissipation structure 800 contacting the silicon substrate 310 of the external resonator 300, the heat dissipation structure 800 is preferably formed with a sufficient height for nearly but not actually reaching the silicon substrate 310 of the external resonator 300. FIG. 4 is a cross sectional view of the variable wavelength laser device 1000B in such a case. The heat dissipation structure 800B illustrated in FIG. 4 has a heat dissipation function somewhat inferior to that of the heat dissipation structure 800 in FIG. 3, but heat emitted by the heater 610 does not stay below the silicon substrate 310 but is dissipated to the substrate 100 through the heat dissipation structure 800B.

Therefore, the variable wavelength laser device 1000B illustrated in FIG. 4 achieves phase control of high precision while restraining occurrence of stress strain in the optical waveguides 410, 420 and occurrence of thermal interference in the wavelength control unit 500 and the like.

To restrain manufacturing cost, the heat dissipation structures 800, 800B are formed on the substrate 100 preferably at the same time when the supports 120 are formed. The manufacturing process of the heat dissipation structure 800B of FIG. 4 will be briefly described with reference to FIGS. 5A-5D.

Figure 5A:
FIG. 5A illustrates a manufacturing process of supports 120 and a heat dissipation structure 800B of another variable wavelength laser device 1000B according to the second example embodiment.
Figure 5B:
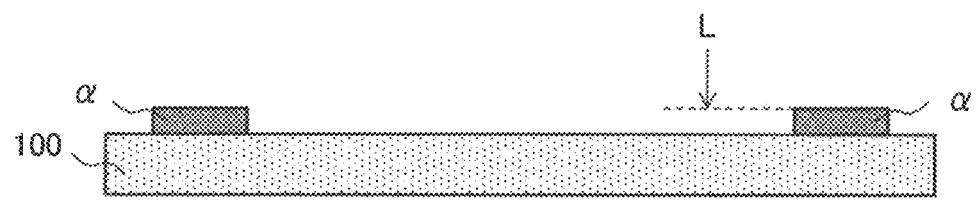
FIG. 5B illustrates a manufacturing process of the supports 120 and the heat dissipation structure 800B of another variable wavelength laser device 1000B according to the second example embodiment.

For example, when it is desired to have a gap L between the heat dissipation structure 800B and the silicon substrate 310, a raising layer α having a thickness L is formed on the top surface of the substrate 100 (FIG. 5A). The raising layer α is formed by, for example, thermally oxidizing the surface of the substrate 100. After that, masking is applied to the regions that are to become the supports 120 and the portions of raising layer α formed in the other regions are removed (FIG. 5B).

Figure 5C:
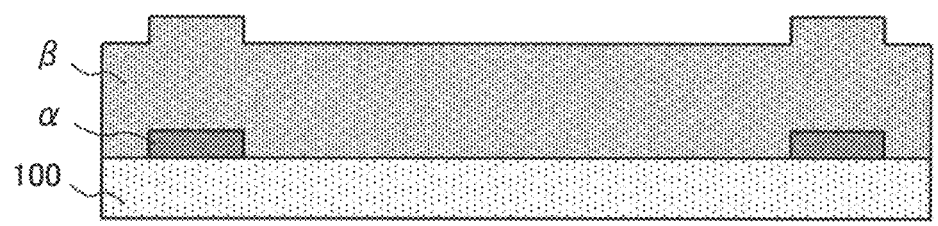
FIG. 5C illustrates a manufacturing process of the supports 120 and the heat dissipation structure 800B of another variable wavelength laser device 1000B according to the second example embodiment.
Figure 5D:
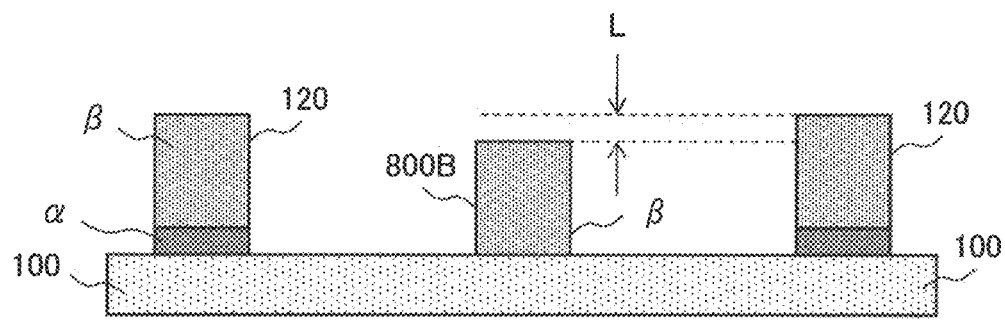
FIG. 5D illustrates a manufacturing process of the supports 120 and the heat dissipation structure 800B of another variable wavelength laser device 1000B according to the second example embodiment.

Next, a layer β, which is to become the supports 120 and the heat dissipation structure 800B, is formed with a sufficient height for supporting the external resonator 300 (FIG. 5C). Material for the supports 120 and the heat dissipation structure 800B may be, for example, boron phosphorus silicon glass (BPSG). After that, masking is applied to the regions that are to become the supports 120 and the heat dissipation structure 800B, and the portions of the layer (BPSG) β formed in the other regions are removed (FIG. 5D). The supports 120 and the heat dissipation structure 800B are thus formed with a gap L between the heat dissipation structure 800B and the silicon substrate 310.

By disposing the external resonator 300 on the supports 120 and above the heat dissipation structure 800B formed as described above, the external resonator 300 is held at a desired height and the heat dissipation structure 800B is disposed beneath the heater 610 with a gap L formed in between. In addition, the heat dissipation structure 800 illustrated in FIG. 3 is formed by skipping the processes illustrated in FIG. 5A and FIG. 5B.

Third Example Embodiment

Figure 6:
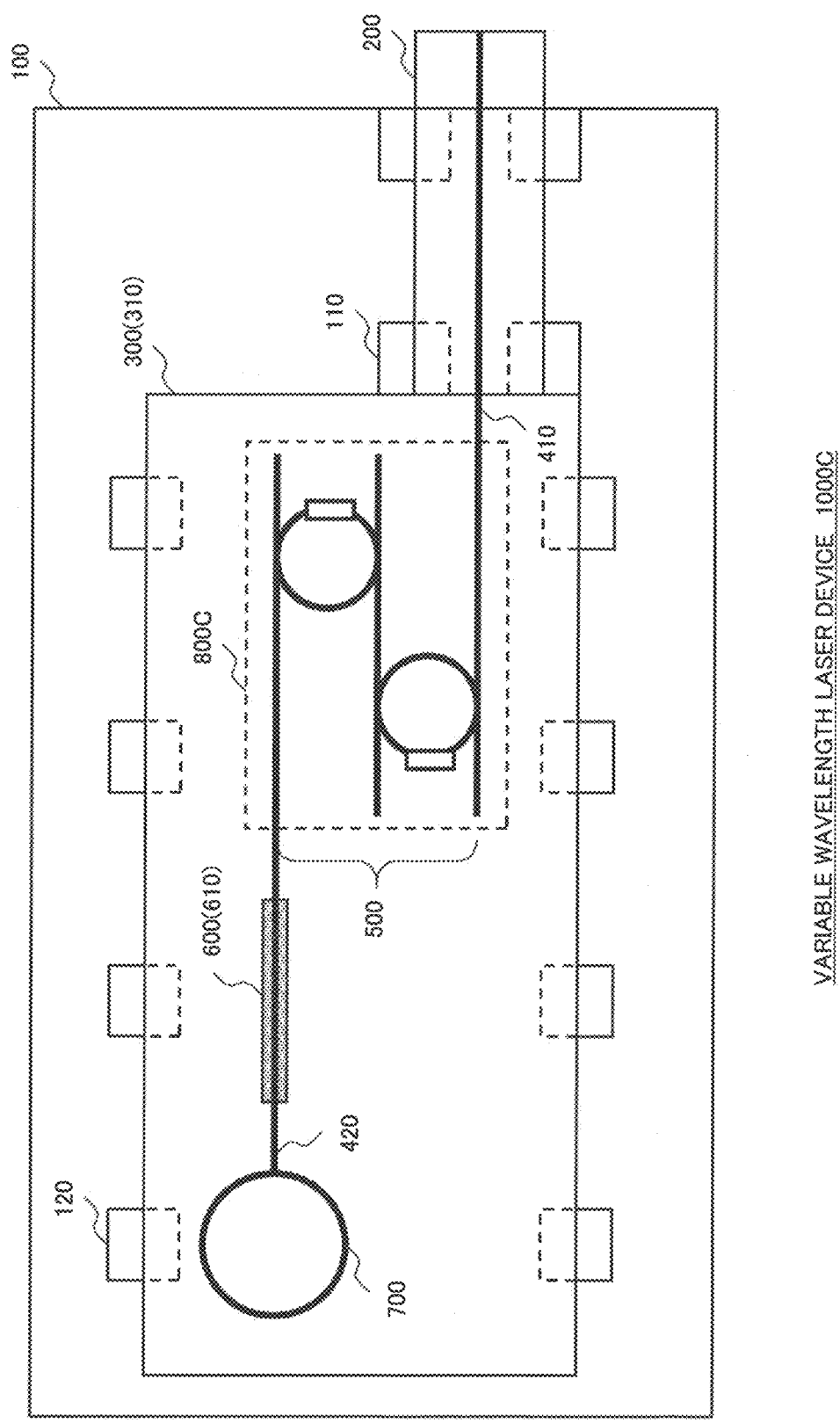
FIG. 6 is a plan view of a variable wavelength laser device 1000C according to a third example embodiment.

A third example embodiment will be described. FIG. 6 is a plan view of a variable wavelength laser device according to the present example embodiment. The variable wavelength laser device 1000 described according to the second example embodiment with reference to FIG. 2 has the heat dissipation structure 800 disposed on the top surface of the substrate 100 beneath the heater 610. The variable wavelength laser device 1000C according to the present example embodiment has a heat dissipation structure 800C on the top surface of the substrate 100 beneath the wavelength control unit 500. In other words, in the present example embodiment, the space beneath the heater 610 is left as it is while the heat dissipation structure 800C is disposed beneath the wavelength control unit 500, with respect to which it is desired to restrain thermal interference.

Since the space beneath the heater 610 is left as it is, heat emitted by the heater 610 stays in the air. This enables efficiently controlling temperature of the second optical waveguide 420 located in the region of the phase control unit 600 without increasing the power supply to the heater 610, thereby changing the phase of light passing through the second optical waveguide 420 with high precision.

The heat flowing from beneath the heater 610 in the direction of wavelength control unit 500 does not stay beneath the wavelength control unit 500 but dissipates to the substrate 100 through the heat dissipation structure 800C. This restrains occurrence of thermal interference in the wavelength control unit 500.

As described above, leaving the space beneath the heater 610 as it is and disposing the heat dissipation structure 800C on the top surface of the substrate 100 beneath the wavelength control unit 500 enables controlling the phase of light passing through the second optical waveguide 420, without increasing the power supply to the heater 610, and restrains occurrence of thermal interference in the wavelength control unit 500.

Note that the heat dissipation structure 800C may be formed with a sufficient height for reaching the silicon substrate 310 of the external resonator 300 or with a sufficient height for nearly but not actually reaching the silicon substrate 310.

Fourth Example Embodiment

Figure 7:
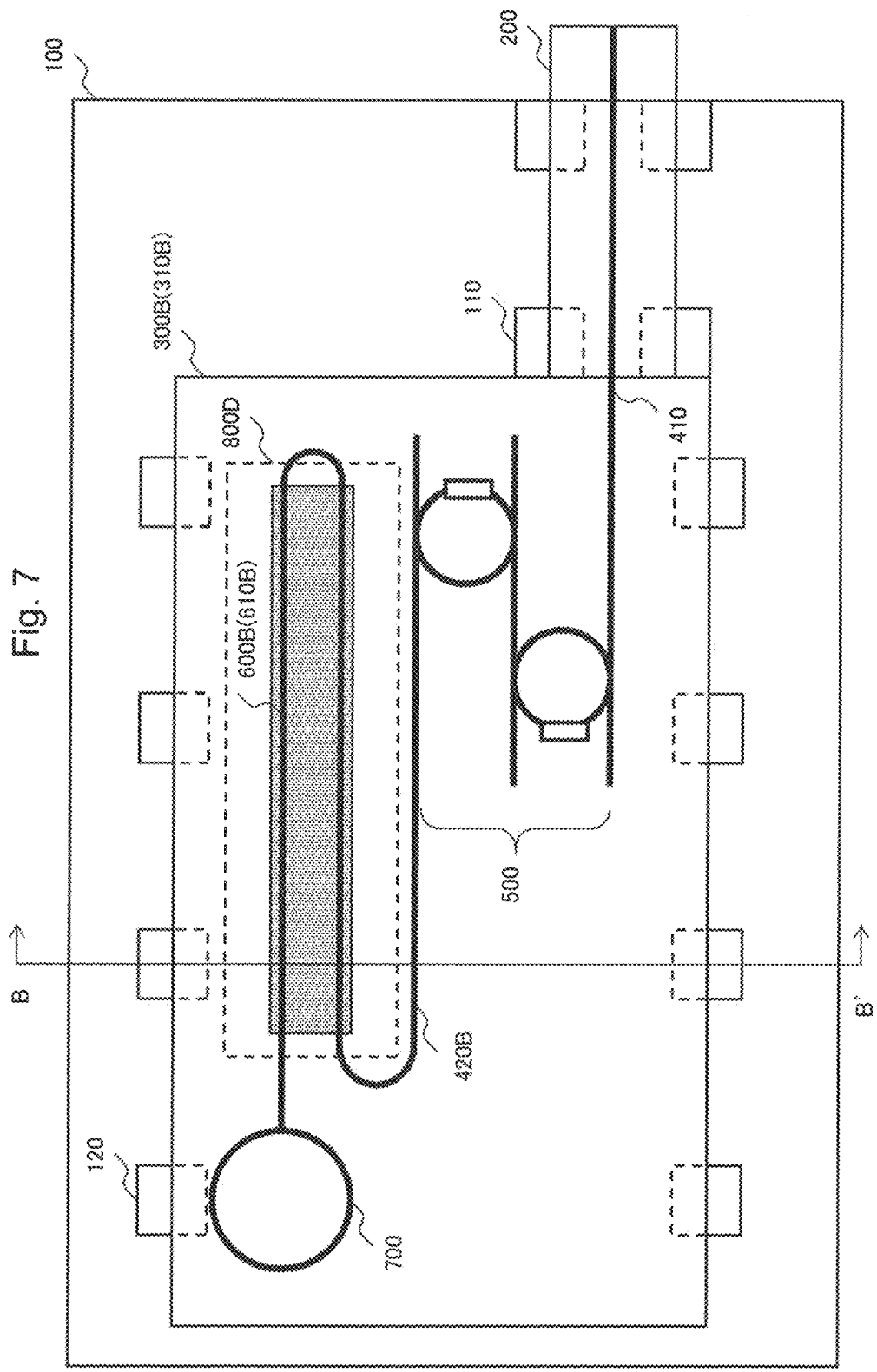
FIG. 7 is a plan view of a variable wavelength laser device 1000D according to a fourth example embodiment.
Figure 8:
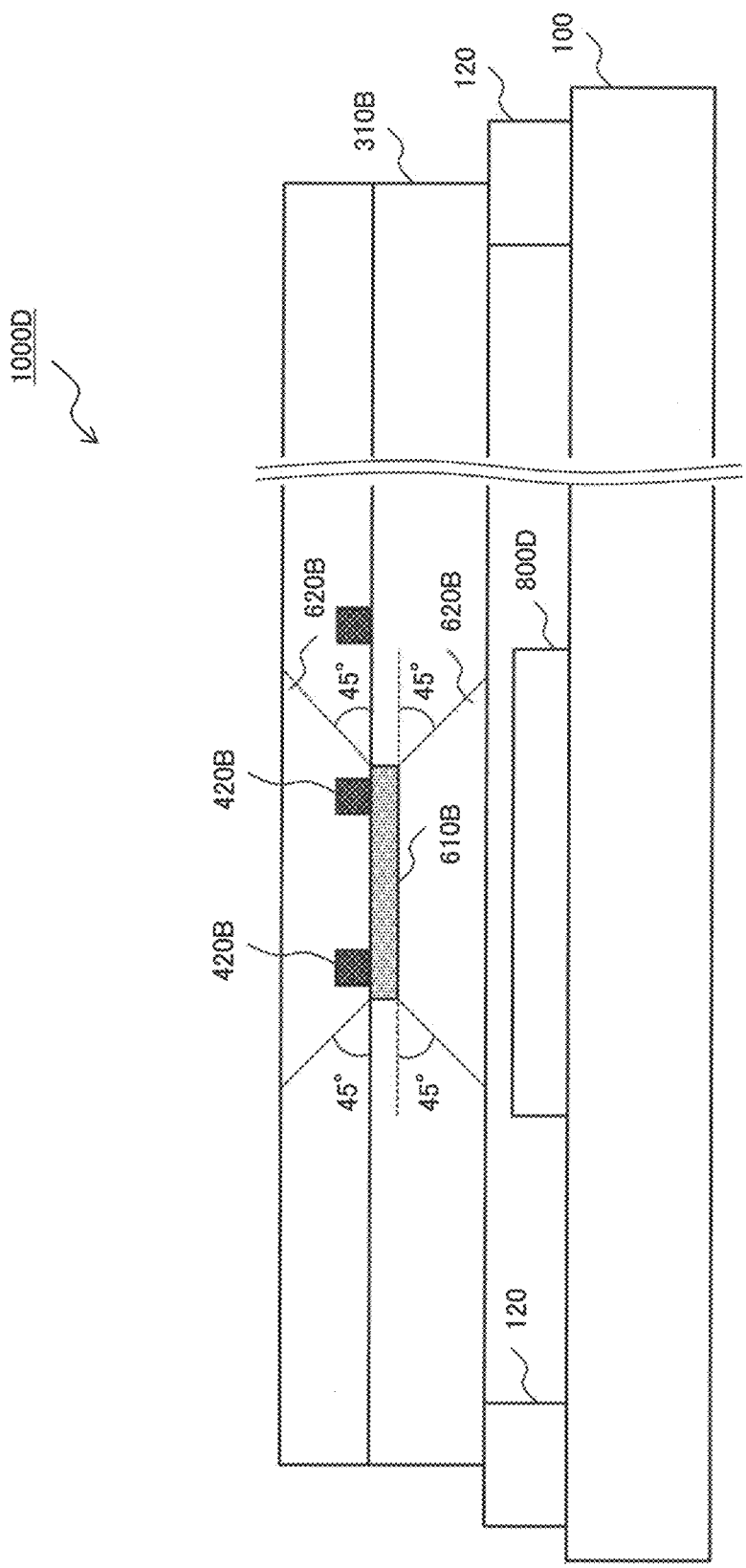
FIG. 8 is a cross sectional view of the variable wavelength laser device 1000D according to the fourth example embodiment.
Figure 9:
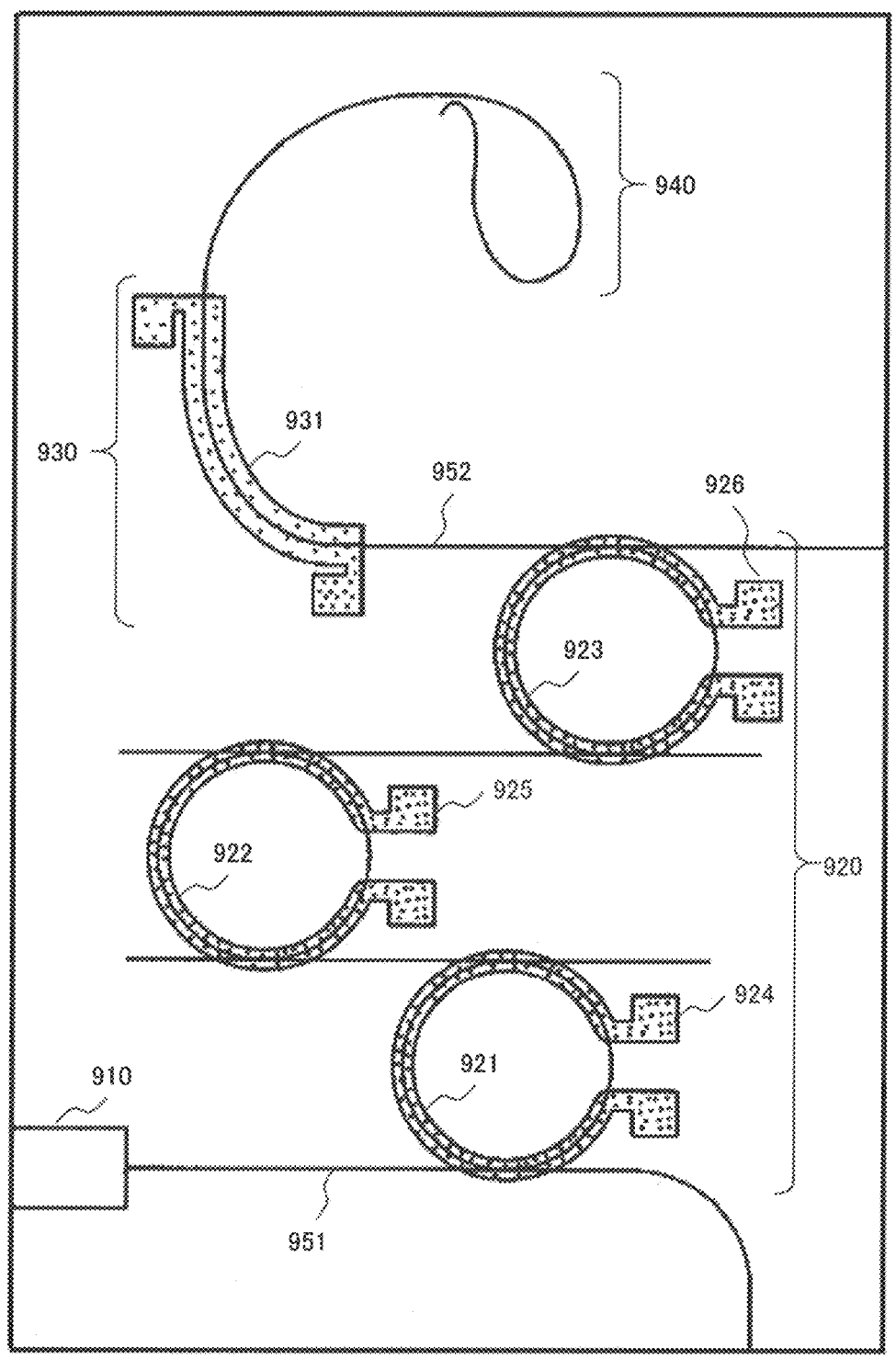
FIG. 9 is a plan view of a variable wavelength laser device 900 according to PTL 1.

A fourth example embodiment will be described. FIG. 7 is a plan view of a variable wavelength laser device according to the present example embodiment. FIG. 8 is a cross sectional view taken along the line B-B' of FIG. 7. The variable wavelength laser device 1000D illustrated in FIG. 7 is provided with a longer second optical waveguide 420B, the temperature of which is controlled by the heater 610B, thereby changing the temperature of the second optical waveguide 420B to a greater extent and changing the phase of light passing through the second optical waveguide 420B to a greater extent.

In FIG. 7, the variable wavelength laser device 1000D includes a substrate 100, a SOA 200, an external resonator 300B, and a heat dissipation structure 800D. The external resonator 300B includes a silicon substrate 310B, a first optical waveguide 410, a second optical waveguide 420B, a wavelength control unit 500, a phase control unit 600B, and a reflection mirror unit 700. The substrate 100, the SOA 200, the silicon substrate 310B, the first optical waveguide 410, the wavelength control unit 500, and the reflection mirror unit 700 are configured in the same manner to those described according to the second example embodiment with reference to FIG. 2.

The phase control unit 600B and the reflection mirror unit 700 are disposed in a line, and the phase control unit 600B includes a long heater 610B, which is formed to be long along this line direction. Using the long heater 610B enables to extend the length of the second optical waveguide 420B, the temperature of which is controlled by the long heater 610B, thereby making it possible to change the phase of light passing through the second optical waveguide 420B to a greater extent. In addition, in the present example embodiment, the second optical waveguide 420B is folded in the phase control unit 600B, thereby expanding the part in which the temperature is controlled.

The heat dissipation structure 800D is formed with a sufficient height for nearly but not actually reach the silicon substrate 310B of the external resonator 300B from the top surface of the substrate 100, and with a sufficient size for encompassing a temperature control space 620B as will be described below.

In general, the heat emitted by the heater 610B diffuses to the space extending in the range between −45° and +45° from the normal direction to the heater 610B as illustrated in FIG. 8. In the following, this space is referred to as the temperature control space 620B. It is known that the temperature in the temperature control space 620B can be maintained constant by the heater 610B.

Therefore, folding the second optical waveguide 420B in the temperature control space 620B enables controlling temperature of a longer waveguide length of the second optical waveguide 420B, thereby changing the phase of light passing through the second optical waveguide 420B to a greater extent.

At the same time, by forming the heat dissipation structure 800D on the substrate 100 with a sufficient size for encompassing the temperature control space 620B, heat emitted by the heater 610B is adequately dissipated to the substrate 100.

As described above, in the variable wavelength laser device 1000D according to the present example embodiment, the long heater 610B is disposed, the second optical waveguide 420B is folded within the temperature control space 620B to enable extending a length of the waveguide to be temperature-controlled, and the heat dissipation structure 800D disposed in such a way as to encompass the temperature control space 620B. Although the power supply to the heater 610B is greater in this case compared with the phase control unit 600 according to the second and the third example embodiments, it is possible to change the phase of light passing through the second optical waveguide 420B to a greater extent and restrain transfer of heat to the wavelength control unit 500 and the like and occurrence of thermal interference.

Therefore, the variable wavelength laser device 1000D according to the present example embodiment achieves phase control in the phase control unit 600B with even higher precision while restraining occurrence of thermal interference in the wavelength control unit 500 and the like.

In the present example embodiment, the example is illustrated in which the second optical waveguide 420B forms one round of reciprocating path within the temperature control space 620B. By properly designing the size of the heater 610B as well as the distance between the heater 610B and the second optical waveguide 420B, a structure in which the second optical waveguide 420B forms one and a half rounds or more of reciprocating path within the temperature control space 620B may also be employed.

In the present example embodiment, the heat dissipation structure 800C is formed with a sufficient height for nearly but not actually reaching the silicon substrate 310B of the external resonator 300B, but the heat dissipation structure 800C may alternatively be formed with a height sufficient for reaching the silicon substrate 310B of the external resonator 300B.

The present invention is not limited to the above-described example embodiments, and any design modifications and the like not departing from the spirit of the present invention will be included in the invention.

INDUSTRIAL APPLICABILITY

The invention of the present application can be applied widely to variable wavelength laser devices constituted with semiconductor optical amplifiers and ring resonator type variable wavelength filters.

This application claims priority based on Japanese Patent Application No. 2014-251457 filed Dec. 12, 2014, the disclosure of which is incorporated herein by reference in its entirety.

REFERENCE SIGNS LIST 10 variable wavelength laser device
20 optical waveguide
30 optical amplification means
40 wavelength control means
50 phase control means
60 reflection means
70 heat dissipation means
100 substrate
110, 120 support
200 SOA
300 external resonator
410 first optical waveguide
420, 420B second optical waveguide
500 wavelength control unit
510, 520 ring resonator
530, 540 thin film heater
600, 600B phase control unit
610, 610B heater
620B temperature control space
700 reflection mirror unit
800, 800B, 800C, 800D heat dissipation structure
900 variable wavelength laser device
910 SOA
920 variable wavelength unit
930 phase-variable unit
940 reflection mirror unit
951 first optical waveguide
952 second optical waveguide
1000, 1000B, 1000C, 1000D variable wavelength laser device

The invention claimed is:
1. A variable wavelength laser device comprising:
an optical waveguide transmitting light between an optical amplifier and a reflector;

the optical amplifier having a non-reflective surface that inputs and outputs light traveling to and from the reflector and a low-reflective surface that reflects light of a wavelength other than a predetermined wavelength and emits light of the predetermined wavelength, a wavelength controller that controls wavelength of light being transmitted through the optical waveguide;

a phase controller that controls phase of light being transmitted through the optical waveguide using heat emitted by a heater;

the reflector that returns light coming through the wavelength controller and the phase controller back to the wavelength controller and the phase controller; and a heat dissipater that restrains transfer of heat emitted by the heater to a region other than a region in which the phase controller is disposed, wherein the wavelength controller and the phase controller are disposed on a same substrate, and the substrate is disposed above a plate member with a support therebetween, and wherein the heat dissipater is disposed on the plate member, and the heat dissipater is formed with a height not sufficient for reaching the substrate and is thermally connected to the substrate.

2. The variable wavelength laser device according to claim 1, wherein the heat dissipater is disposed on the plate member and beneath the heater.

3. The variable wavelength laser device according to claim 1, wherein the heat dissipater is disposed on the plate member and beneath the wavelength controller.

4. The variable wavelength laser device according to claim 1, wherein the optical waveguide is folded over within a temperature control space of the heater.

* * * * *